(12) United States Patent
Hsieh et al.

(10) Patent No.: US 7,795,895 B2
(45) Date of Patent: Sep. 14, 2010

(54) LOOP-BACK TESTING METHOD AND APPARATUS FOR IC

(75) Inventors: Chih-Yuan Hsieh, Taichung County (TW); Chun-Wen Yeh, Hsinchu County (TW)

(73) Assignee: MStar Semiconductor, Inc., ChuPei, Hsin-Chu Hsien (TW)

( * ) Notice: Subject to any disclaimer, the term of this patent is extended or adjusted under 35 U.S.C. 154(b) by 182 days.

(21) Appl. No.: 11/946,806

(22) Filed: Nov. 28, 2007

(65) Prior Publication Data
US 2009/0134903 A1 May 28, 2009

(51) Int. Cl.
*G01R 31/26* (2006.01)
(52) U.S. Cl. ...................................... 324/765
(58) Field of Classification Search ................. 324/765; 340/572.1
See application file for complete search history.

(56) References Cited

U.S. PATENT DOCUMENTS

| | | | |
|---|---|---|---|
| 6,236,223 B1* | 5/2001 | Brady et al. | 324/765 |
| 2007/0273481 A1* | 11/2007 | Soleimani | 340/10.1 |
| 2008/0094183 A1* | 4/2008 | Fukushima et al. | 340/10.51 |
| 2008/0100329 A1* | 5/2008 | Nguyen et al. | 324/765 |

* cited by examiner

*Primary Examiner*—Ha Tran T Nguyen
*Assistant Examiner*—Arleen M Vazquez
(74) *Attorney, Agent, or Firm*—Winston Hsu

(57) ABSTRACT

A test system for testing operability of integrated circuits includes: a first IC, for modulating a first signal to generate a first modulated signal and transmitting the first modulated signal, and for receiving a second modulated signal and demodulating the second modulated signal to generate a second signal; a first loop antenna, coupled to the first IC, for receiving the first modulated signal and sending the first modulated signal back to the first IC as the second modulated signal; and a tester circuit coupled to the first IC, for generating the first signal to the first IC, receiving the second signal from the first IC, and comparing the first signal and the second signal to determine the operability of the first IC.

12 Claims, 4 Drawing Sheets

LOOP-BACK TESTING METHOD AND APPARATUS FOR IC

BACKGROUND OF THE INVENTION

1. Field of the Invention

The present invention relates to IC testing, and particularly relates to a loop-back method of testing ICs.

2. Description of the Prior Art

The invention of the integrated circuit, or chip, was one of the most important developments in electronics. Integrated circuits (ICs) are present in almost all modern electrical devices from cellular phones to refrigerators. Communication systems, transport systems, manufacturing and computing all depend on the existence of ICs. Integrated circuits are also an integral part of modern transceivers.

Transceivers are electronic devices that have a combined receiver and transmitter. In general, a significant amount of circuitry is shared between the receiver and transmitter. As the receiving and transmitting parts of the transceiver still have some individual circuitry, it is possible for the receiving part to have functionality when the transmitting part does not (and vice versa). Therefore, to determine operability of an IC, both receiving and transmitting functions need to be tested.

In conventional systems, testing of transmission quality and receiving quality is performed separately. Please refer to FIG. 1. FIG. 1 is a diagram of a conventional test system 100 for testing transmitting operability of an IC. The test system 100 comprises: an HF RFID IC 150, comprising a digital processor 140, a transmitter 130 and a receiver 120; a loop antenna 160; and a high cost tester 170. The IC 150 will transmit a signal to the loop antenna 160, which then passes the signal to the high cost tester 170 for monitoring the waveform of the signal. The high cost tester 170 has to perform sophisticated analysis on the transmitted signal in order to determine operability of the HF RFID IC 150.

Please refer to FIG. 2. FIG. 2 is a diagram of a conventional test system 200 for testing receiving operability of an IC. Components having the same function as those shown in FIG. 1 are given the same numerals. The system 200 also includes a responder 270, which may be a tag or a near field communication (NFC) device, and can transmit data to the IC 150 directly (active mode) or respond to a command (passive mode). The IC 150 will receive, demodulate and decode the data from the responder 270, and if a bit error rate of the data is higher than certain thresholds, the chip will be determined to be a bad chip.

In both testing cases, high quality circuitry is required for confirming the accuracy of the IC. Therefore, the testing process is both time-consuming and expensive.

SUMMARY OF THE INVENTION

It is therefore an objective of the present invention to provide a method and apparatus for testing ICs that can test for transmission and receiving processes together, and requires less expensive circuitry than the related art.

A test system for testing operability of integrated circuits according to an exemplary embodiment of the present invention comprises: a first IC, for modulating a first signal to generate a first modulated signal and transmitting the first modulated signal, and for receiving a second modulated signal and demodulating the second modulated signal to generate a second signal; a first loop antenna, coupled to the first IC, for receiving the first modulated signal and sending the first modulated signal back to the first IC as the second modulated signal; and a tester circuit coupled to the first IC, for generating the first signal to the first IC, receiving the second signal from the first IC, and comparing the first signal and the second signal to determine the operability of the first IC. The first signal can also be sent to a second IC, modulated and transmitted to a second loop antenna, and sent back to the second IC and compared with the first signal to determine operability of the second IC.

A method according to the exemplary embodiment of the present invention is also provided. The method comprises: generating a first signal and sending the first signal to a first IC; utilizing the first IC to modulate the first signal to generate a first modulated signal; transmitting the first modulated signal to a first loop antenna; utilizing the first loop antenna to send the first modulated signal back to the first IC as a second modulated signal; utilizing the first IC to demodulate the second modulated signal to generate a second signal; and comparing the first signal and the second signal to determine operability of the first IC. The method can further comprise sending the first signal to a second IC; modulating the signal and sending the modulated signal to a second loop antenna; sending the signal back to the second IC; and comparing the signal with the first signal to determine operability of the second IC.

These and other objectives of the present invention will no doubt become obvious to those of ordinary skill in the art after reading the following detailed description of the preferred embodiment that is illustrated in the various figures and drawings.

DETAILED DESCRIPTION

The present invention utilizes a test system that can test for transmission and receiving quality of an IC at the same time.

Figure 1:
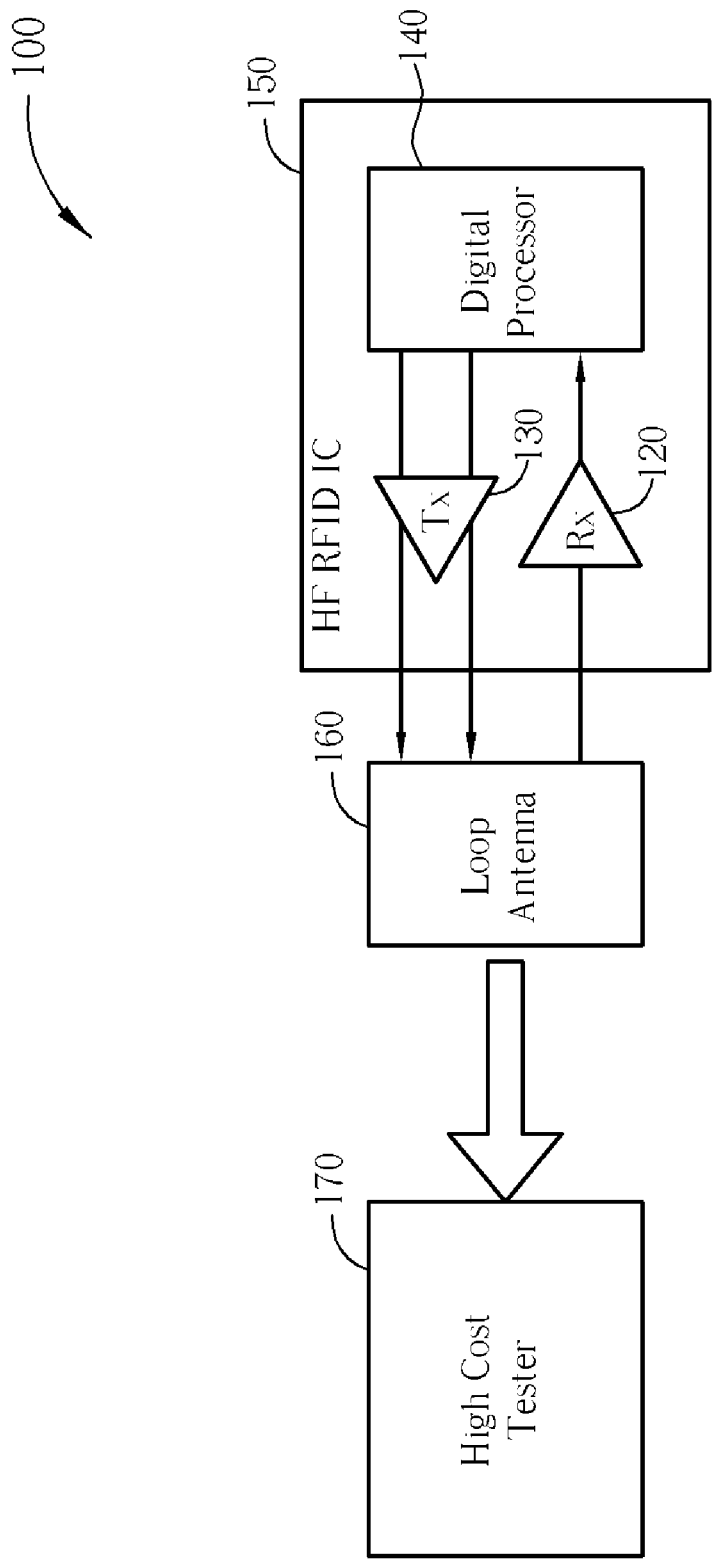
FIG. 1 is a diagram of a conventional test system for determining transmitting operability of an IC.
Figure 2:
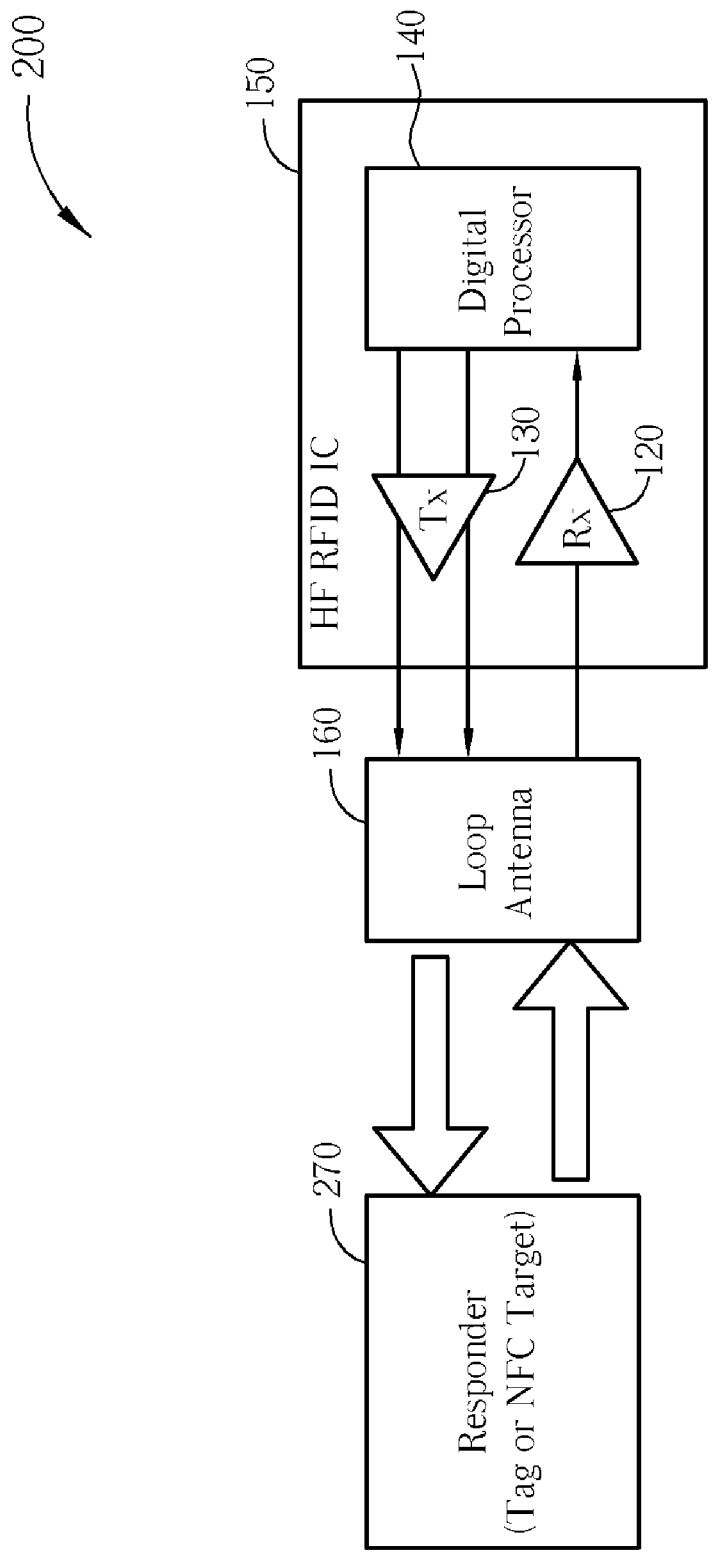
FIG. 2 is a diagram of a conventional test system for determining receiving operability of an IC.
Figure 3:
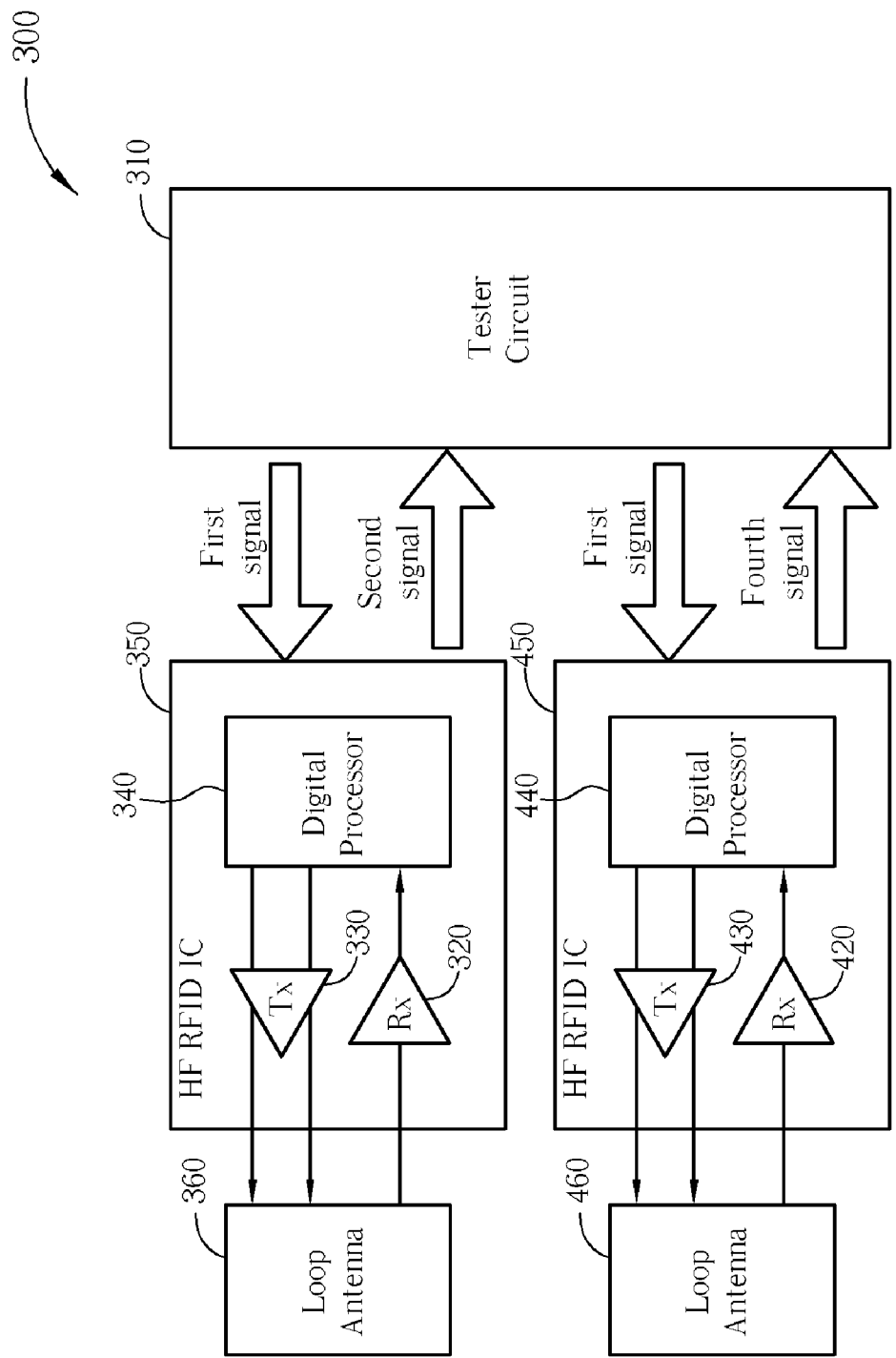
FIG. 3 is a diagram of a test system for determining operability of an IC according to an exemplary embodiment of the present invention.

Please refer to FIG. 3. FIG. 3 is a diagram of a test system 300 according to an exemplary embodiment of the present invention. The test system 300 can be utilized for testing one IC each time or two or more ICs at the same time. This embodiment shows the case when two ICs are being tested at the same time, but is not meant to limit the scope of the invention. The test system 300 comprises: a first IC 350 and a second IC 450, a first loop antenna 360 coupled to the first IC 350, a second loop antenna 460 coupled to the second IC 450, and a tester circuit 310 coupled to the first IC 350 and the second IC 450. As in the conventional test systems 100, 200 the ICs 350, 450 are HF RFID ICs, and respectively comprise a digital processor 340, 440, a transmitting circuit 330, 430, and a receiving circuit 320, 420.

For simplicity, the following example will refer to testing of the first IC 350 only. Please note that the testing method for the second IC 450 is identical. The tester circuit 310 generates a first signal and sends the first signal to the first IC 350. The digital processor 340 modulates the first signal and sends the modulated signal to the first loop antenna 360 through the transmitting circuit 330. The IC 350 is therefore acting as a transmitter at this point. The first signal is at a baseband frequency and modulation of the first signal converts the first signal up to radio frequency (RF). When the loop antenna 360 receives the first modulated signal (RF signal) it will send the modulated signal back to the first IC 350 as a second modulated signal. The first IC 350 receives the second modulated signal through the receiving circuit 320 and the digital processor 340 de-modulates the signal to convert the signal back down to baseband frequency (second signal). The IC 350 is therefore acting as a receiver at this point.

The de-modulated signal (second signal) is then sent to the tester circuit 310 where it can be compared with the first signal. As no other processes apart from modulation and de-modulation have been performed on the signals, the second signal should be the same as the first signal. Therefore, by comparing the two baseband signals with each other, the operability of the first IC 350 can be directly determined. As the comparison takes place between two signals at baseband frequency, the comparison operation is much less complicated than the signal analysis required by the prior art. Furthermore, as the signal has undergone both transmitting and receiving processes, a fault in the IC 350 can be instantly determined. As it is not necessary to know which function (receiving or transmitting) of the IC 350 is faulty, determination of inoperability can be performed more efficiently than in the related art.

As mentioned above, testing of the second IC 450 can be performed in exactly the same way. The tester circuit 310 will send the same first signal to the second IC 450. Although the second IC 450 may have a different modulation index from the first IC 350, once the signal is returned to the second IC 450 by the second loop antenna 460 and demodulated, the returned signal will be equivalent to the first signal originally generated by the tester circuit 310 (provided the second IC 450 is operable). For clarity of illustration, the returned signal from the second IC 450 has been annotated as fourth signal in FIG. 3.

Figure 4:
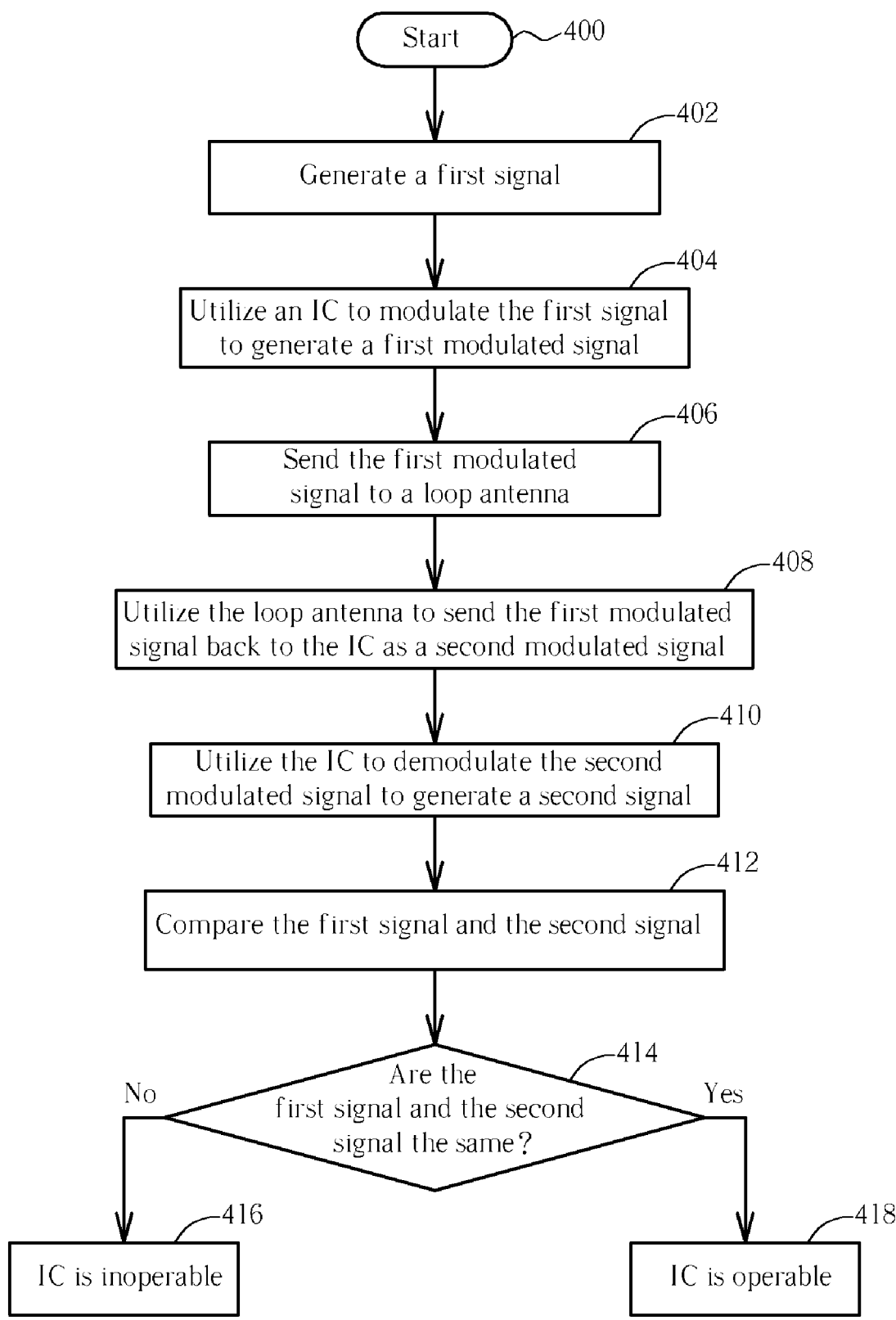
FIG. 4 is a flowchart detailing steps of determining operability of an IC according to the exemplary embodiment of the present invention shown in FIG. 3.

Please refer to FIG. 4. FIG. 4 is a flowchart of the operation of the test system. The steps are as follows:

Step 400: Start;
Step 402: Generate a first signal;
Step 404: Utilize an IC to modulate the first signal to generate a first modulated signal;
Step 406: Send the first modulated signal to a loop antenna;
Step 408: Utilize the loop antenna to send the first modulated signal back to the IC as a second modulated signal;
Step 410: Utilize the IC to demodulate the second modulated signal to generate a second signal;
Step 412: Compare the first signal and the second signal;
Step 414: Are the first signal and the second signal the same? If no go to Step 416; if yes go to Step 418;
Step 416: IC is inoperable;
Step 418: IC is operable.

As shown in FIG. 3, the test system 300 can test two ICs at the same time by using the single tester circuit 310. The first signal is simultaneously input to the first IC 350 and the second IC 450, and then modulated and respectively sent to the first loop antenna 360 and the second loop antenna 460 as a first modulated signal and third modulated signal respectively. If the first IC 350 and second IC 450 have different modulation indexes then the first modulated signal and third modulated signal will not be equivalent to each other. As mirror operations are performed on the first signal (i.e. modulation and de-modulation), however, it does not matter if these signals (first modulated signal and third modulated signal) are different as determination of operability depends on a comparison between signals (first signal vs. second signal and first signal vs. fourth signal) and not on the content of the signal itself.

The first loop antenna 360 and the second loop antenna 460 respectively send the first modulated signal and third modulated signal back to the first IC 350 and second IC 450 as a second modulated signal and a fourth modulated signal. The digital processor 340 and the digital processor 440 respectively demodulate the second modulated signal and fourth modulated signal to respectively generate a second signal and a fourth signal to be sent to the tester circuit 310. The tester circuit 310 then compares the second signal and fourth signal (baseband signals) with the originally generated first (baseband) signal. If all signals are the same then it can be confirmed that the first IC 350 and second IC 450 are in working order. If either the second signal or the fourth signal is not the same as the first signal then either the transmission function of the corresponding IC is broken, the receiving function is broken, or both functions are broken. As an IC is unworkable if one function is broken, it is unnecessary to determine which particular function is broken.

The tester circuit 310 can determine the accuracy of the IC utilizing various methods. A preferred method is to count the transitions of the generated signal and the transitions of the received signal. It is also possible to compare the data, i.e. the waveforms, although this method will take longer than the aforementioned one. All methods of comparing the generated signal with the received signal in the testing circuit fall within the scope of the invention. One exemplary example of comparing the originally generated first (baseband) signal with either the second signal or the fourth signal (baseband signals) is to count the number of rising edges or falling edges of both of the baseband signals and then determine if the numbers are identical. If the number of rising/falling edges of the first signal is the same as that of the second or the fourth signal then the first signal is determined to be identical to the second signal or the fourth signal.

It should be noted that the method and circuit of the present invention can be utilized for all coding types of ICs, as the signal received by the IC 350, 450 is demodulated and then directly compared with the signal generated by the tester circuit 310.

By combining testing of receiving and transmitting capability of an IC into a single testing step, the present invention is more efficient and less expensive than conventional testing methods.

Those skilled in the art will readily observe that numerous modifications and alterations of the device and method may be made while retaining the teachings of the invention.

What is claimed is:

1. A test system for testing operability of integrated circuits, the test system comprising:
   a first IC, for modulating a first signal to generate a first modulated signal and transmitting the first modulated signal, and for receiving a second modulated signal and demodulating the second modulated signal to generate a second signal;
   a first loop antenna, coupled to the first IC, for receiving the first modulated signal and sending the first modulated signal back to the first IC as the second modulated signal; and
   a tester circuit coupled to the first IC, for generating the first signal to the first IC, receiving the second signal from the first IC, and comparing the first signal and the second signal to determine the operability of the first IC.

2. The test system of claim 1, further comprising:
a second IC, coupled to the first tester, for receiving the first signal, modulating the first signal to generate a third modulated signal and transmitting the third modulated signal, and for receiving a fourth modulated signal and demodulating the fourth modulated signal to generate a fourth signal; and
a second loop antenna, coupled to the second IC, for receiving the third modulated signal and sending the third modulated signal back to the second IC as the fourth modulated signal;
wherein the tester circuit receives the fourth signal from the second IC, and further compares the first signal with the fourth signal to determine operability of the second IC.

3. The test system of claim 2, wherein the first IC and the second IC have different modulation indexes.

4. The test system of claim 1, wherein the tester circuit compares the first signal with the second signal by comparing the number of transitions of the first signal and the second signal.

5. The test system of claim 1, wherein the tester circuit compares the first signal with the second signal by comparing waveforms of the first signal and the second signal.

6. The test system of claim 1, wherein the first IC is an RFID IC.

7. A method of determining operability of integrated circuits, the method comprising:
generating a first signal and sending the first signal to a first IC;
utilizing the first IC to modulate the first signal to generate a first modulated signal;
transmitting the first modulated signal to a first loop antenna;
utilizing the first loop antenna to send the first modulated signal back to the first IC as a second modulated signal;
utilizing the first IC to demodulate the second modulated signal to generate a second signal; and
comparing the first signal and the second signal to determine operability of the first IC.

8. The method of claim 7, further comprising:
sending the first signal to a second IC;
utilizing the second IC to modulate the first signal to generate a third modulated signal;
transmitting the third modulated signal to a second loop antenna;
utilizing the second loop antenna to send the third modulated signal back to the second IC as a fourth modulated signal;
utilizing the second IC to demodulate the fourth modulated signal to generate a fourth signal; and
comparing the first signal and the fourth signal to determine operability of the second IC.

9. The method of claim 8, wherein the first IC and the second IC have different modulation indexes.

10. The method of claim 7, wherein the step of comparing the first signal and the second signal to determine operability of the first IC comprises:
comparing the number of transitions of the first signal and the second signal.

11. The method of claim 7, wherein the step of comparing the first signal and the second signal to determine operability of the first IC comprises:
comparing waveforms of the first signal and the second signal.

12. The method of claim 7, wherein the first IC is an RFID IC.

* * * * *